US010580489B2

(12) United States Patent
Das et al.

(10) Patent No.: US 10,580,489 B2
(45) Date of Patent: Mar. 3, 2020

(54) METHOD, SYSTEM AND DEVICE FOR COMPLEMENTARY IMPEDANCE STATES IN MEMORY BITCELLS

(71) Applicant: ARM Ltd., Cambridge (GB)

(72) Inventors: Shidhartha Das, Upper Cambourne (GB); Glen Arnold Rosendale, Palo Alto, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/960,277

(22) Filed: Apr. 23, 2018

(65) Prior Publication Data
US 2019/0325955 A1 Oct. 24, 2019

(51) Int. Cl.
G11C 13/00 (2006.01)
G11C 11/16 (2006.01)

(52) U.S. Cl.
CPC ...... *G11C 13/0026* (2013.01); *G11C 11/1655* (2013.01); *G11C 11/1657* (2013.01); *G11C 13/0028* (2013.01)

(58) Field of Classification Search
CPC ............ G11C 13/0026; G11C 11/1655; G11C 11/1657; G11C 13/0028
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,646,626 | B2 * | 1/2010 | Parkinson ............ G11C 7/065 365/148 |
| 7,778,063 | B2 | 8/2010 | Brubaker et al. |
| 7,872,900 | B2 | 1/2011 | Paz De Araujo et al. |
| 9,349,426 | B1 | 5/2016 | Roy et al. |
| 9,514,814 | B1 | 12/2016 | Sandhu et al. |
| 9,548,118 | B1 | 1/2017 | Bhavnagarwala et al. |
| 9,558,819 | B1 | 1/2017 | Aitken et al. |
| 9,589,636 | B1 | 3/2017 | Bhavnagarwala et al. |
| 9,621,161 | B1 | 4/2017 | Das et al. |
| 9,660,189 | B1 | 5/2017 | Reid et al. |
| 9,734,895 | B2 | 8/2017 | Savanth et al. |
| 9,735,360 | B2 | 8/2017 | Shifren et al. |

(Continued)

FOREIGN PATENT DOCUMENTS

JP     2015170378 A     9/2015

OTHER PUBLICATIONS

Notification of Transmittal of the International Search Report and the Written Opinion of the International Searching Authority, or the Declaration, App. No. PCT/GB2019/050818, dated Jun. 18, 2019, 1 Page.

(Continued)

*Primary Examiner* — Gene N Auduong
(74) *Attorney, Agent, or Firm* — Berkeley Law & Technology Group, LLP

(57) ABSTRACT

Disclosed are methods, systems and devices for operation of memory device. In one aspect, a bitcell may represent a binary value, symbol, parameter or condition based on complementary impedance states of first and second memory elements. In one aspect, a first bitline and a second bitline may be coupled to terminals of the first and second memory elements. A circuit may detect the complementary impedance states responsive to a difference in a rates of charging of the first and second bitlines.

18 Claims, 8 Drawing Sheets

(56) References Cited

U.S. PATENT DOCUMENTS

| | | |
|---|---|---|
| 9,735,766 B2 | 8/2017 | Shifren |
| 9,747,982 B1 | 8/2017 | Shifren et al. |
| 9,748,943 B2 | 8/2017 | Sandhu et al. |
| 9,755,146 B2 | 9/2017 | Shifren et al. |
| 9,773,550 B2 | 9/2017 | Bhavnagarwala et al. |
| 9,786,370 B2 | 10/2017 | Aitken et al. |
| 9,792,982 B1 | 10/2017 | Sandhu |
| 9,792,984 B1 | 10/2017 | Bhavnagarwala et al. |
| 9,805,777 B2 | 10/2017 | Sandhu et al. |
| 9,851,738 B2 | 12/2017 | Sandhu et al. |
| 9,871,528 B1 | 1/2018 | Kumar et al. |
| 9,899,083 B1 | 2/2018 | Rosendale |
| 9,947,402 B1 | 4/2018 | Bhavnagarwala et al. |
| 9,972,388 B2 | 5/2018 | Das et al. |
| 9,978,942 B2 | 5/2018 | Shifren et al. |
| 9,979,385 B2 | 5/2018 | Sandhu et al. |
| 9,990,992 B2 | 6/2018 | Bhavnagarwala et al. |
| 9,997,424 B2 | 6/2018 | Arvin et al. |
| 10,002,665 B1 | 6/2018 | Bhargava et al. |
| 10,002,669 B1 | 6/2018 | Bhargava et al. |
| 10,032,487 B2 | 7/2018 | Shifren et al. |
| 2008/0107801 A1 | 5/2008 | Celinska et al. |
| 2013/0285699 A1 | 10/2013 | McWilliams et al. |
| 2015/0085560 A1 | 3/2015 | Candelier et al. |
| 2015/0170717 A1 | 6/2015 | Kern et al. |
| 2016/0163978 A1 | 6/2016 | Paz De Araujo et al. |
| 2016/0247564 A1* | 8/2016 | Gopinath ............ G11C 13/0011 |
| 2017/0047116 A1 | 2/2017 | Sandhu et al. |
| 2017/0069378 A1 | 3/2017 | Shifren et al. |
| 2017/0092858 A1 | 3/2017 | Shifren |
| 2017/0110191 A1 | 4/2017 | Aitken et al. |
| 2017/0147207 A1 | 5/2017 | Hansson et al. |
| 2017/0178722 A1 | 6/2017 | Pasotti et al. |
| 2017/0244027 A1 | 8/2017 | Reid et al. |
| 2017/0244032 A1 | 8/2017 | Reid et al. |
| 2017/0288675 A1 | 10/2017 | Chandra et al. |
| 2018/0095114 A1 | 4/2018 | Bhargave et al. |
| 2018/0096713 A1 | 4/2018 | Chandra et al. |

OTHER PUBLICATIONS

International Search Report, App. No. PCT/GB2019/050818, dated Jun. 18, 2019, 5 Pages.

Written Opinion of the International Searching Authority, App. No. PCT/GB2019/050818, dated Jun. 18, 2019, 10 Pages.

* cited by examiner

METHOD, SYSTEM AND DEVICE FOR COMPLEMENTARY IMPEDANCE STATES IN MEMORY BITCELLS

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments is still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Despite advantages of certain non-volatile memory technologies in computing operations, longer access times (e.g., latencies in connection with read operations) may limit the use of non-volatile memory in real-time computing operations.

SUMMARY

Briefly, a particular implementations are directed to a device comprising: a first memory element and a second memory element to have complementary impedance states, the complementary impedance states to collectively represent a binary symbol, value, condition or parameter, a first terminal of the first memory element and a first terminal of the second memory element being coupled to one or more reference nodes; a first bitline coupled to a second terminal of the first memory element; a second bitline coupled to a second terminal of the second memory element; and a circuit to detect the complementary impedance states responsive to a difference in a rates of charging of the first and second bitlines.

Another particular implementation is directed to a method comprising coupling a first bitline, the first bitline being connected to a first memory element, to one or more voltage sources; coupling a second bitline, the second bitline be connected to a second memory element, to the one or more voltage sources, the first and second memory elements being in complementary impedance states to collectively represent a binary symbol, value, condition or parameter; and detecting the complementary impedance states based, at least in part, on a difference in rates of charging of the first and second bitlines responsive to the coupling of the first and second bitlines to the first and second voltage sources.

Another particular implementation is directed to an apparatus comprising: a plurality of bitcells formed as an array bitcells, each bitcell comprising first and second memory elements, each bitcell being coupled to at least one other bitcell by a first bitline and a second bitline, wherein the first memory element and a second memory element to have complementary impedance states, the complementary impedance states to collectively represent a binary symbol, value, condition or parameter; and at least one circuit to detect the complementary impedance states of first and second memory elements of a selected one of the plurality of bitcells responsive to a difference in rates of charging of the first and second bitlines.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
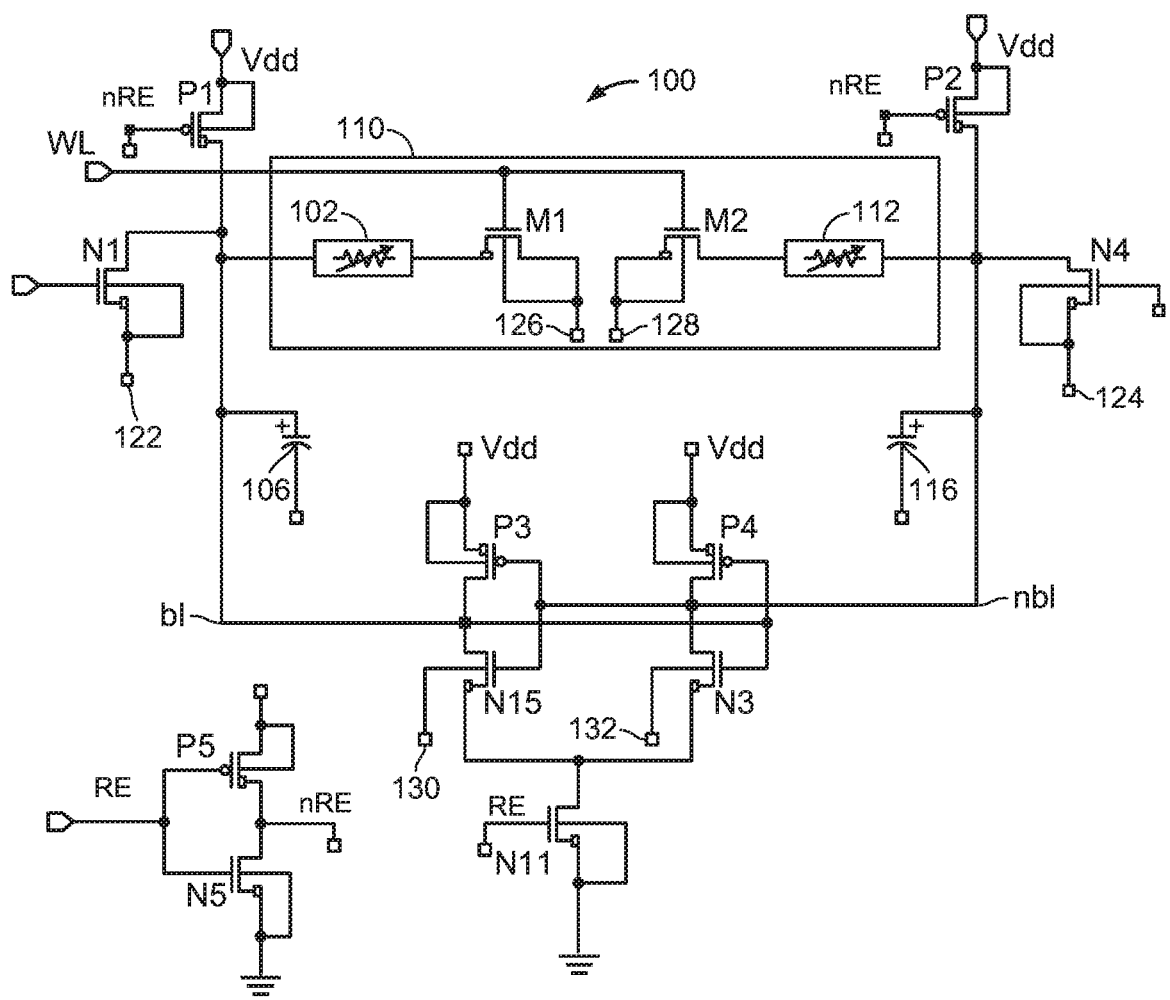
FIG. 1A is a schematic diagram of a circuit for performing read operations in connection with a bitcell.
Figure 1B:
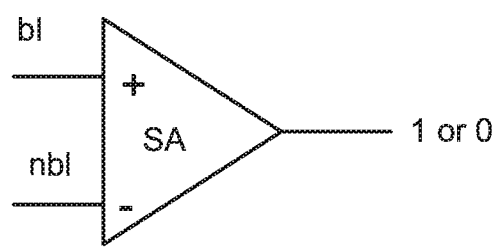
FIG. 1B is a schematic diagram of a sense amplifier for use in performing read operations according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

According to an embodiment, a computing device or computing platform may incorporate volatile memory systems and non-volatile memory systems to perform computing operations. In one embodiment, a memory device may comprise a "volatile" memory device that may maintain a particular memory state while power is applied to the volatile memory device, but may lose the particular memory state if power is removed. In another embodiment, a memory device may comprise a "non-volatile" memory that may maintain a particular memory state even after power is removed from the memory device.

A volatile memory system or non-volatile memory system may maintain memory states to represent values, symbols, parameters and/or conditions as memory states such as "bitcells." In this context, a "bitcell" or "bitcell circuit" as referred to herein comprises a circuit or portion of a circuit capable of representing a value, symbol or parameter as a state. For example, a bitcell may comprise one or more memory devices that are capable of representing a value, symbol or parameter as a memory state of the memory device. In particular implementations, a volatile memory device may be made up of "volatile memory" bitcells that may lose a detectable memory state after power is removed from the volatile memory bitcells. Likewise, a non-volatile memory device may be made up of "non-volatile memory" bitcells capable of maintaining a detectable memory state after power is removed from the non-volatile memory bitcells.

Particular embodiments described herein are directed to devices and techniques for enabling high speed read operations on non-volatile memory devices such as memory devices that represent a binary symbol, value parameter or condition as in impedance state. In an example implementation, a first memory element and a second memory element may have complementary impedance states to collectively represent a binary symbol, value, condition or parameter. A first bitline may be coupled to a second terminal of the first memory element and a second bitline may be coupled to a second terminal of the second memory element. The complementary impedance states of the first and second memory elements may be detected responsive to a difference in rates of charging of the first and second bitlines. The aforementioned encoding scheme to store a single binary value, symbol, parameter or condition using complementary impedance states of two memory elements may enable an active sense-amplifier for a read-path that may significantly accelerate read performance up to an order of gigahertz. This may enable read operations sufficiently fast to provide L1 cache-like performance (GHz+) for bitcells using memory elements that represent a memory state as an impedance state such as, for example, memory elements formed from correlated electron materials.

FIG. 1A is a schematic diagram of a circuit 100 for performing read operations in connection with a bitcell circuit 110 according to an embodiment. Bitcell circuit 110 comprises first and second memory elements 102 and 112 capable of representing or maintaining a memory state as an impedance between terminals. For example, memory element 102 may maintain a memory state as an impedance between a bitline bl and a node between memory element 102 and a terminal of FET M1. Likewise, memory element 112 may maintain a memory state as an impedance between a bitline nbl and a node between memory element 112 and a terminal of FET M2. In this context, a "bitline" comprises a conductor that is connectable to at least a portion of a bitcell circuit during a write operation to transmit a signal altering a memory state of the bitcell circuit, or during a read operation to transmit a signal to at least a portion of a bitcell circuit to place the bitcell circuit in a particular memory state.

Memory elements 102 and 112 may be formed as any one of several devices with material capable of maintaining a detectable impedance state such as, for example, any of the aforementioned memory technologies such as correlated electron switches (CESs) formed from a correlated electron material. It should be understood, however, that this is merely an example of a type of device capable of maintaining a detectable impedance state as a memory state, and claimed subject matter is not limited in this respect.

According to an embodiment, bitcell circuit 110 may express or represent a single binary value, symbol, parameter or condition based on complementary impedance states of memory elements 102 and 112 to represent a single binary value, symbol, parameter or condition. For example, bitcell circuit 100 may express or represent a first single binary value, symbol, parameter or condition if memory element 102 is in a conductive or low impedance state while memory element 112 is in an insulative or high impedance state. Likewise, bitcell circuit 100 may express or represent a first single binary value, symbol, parameter or condition if memory element 102 is in a conductive or low impedance state while memory element 112 is in an insulative or high impedance state. In a particular implementation, memory elements 102 and 112 may be placed in complementary impedance states in "write operations" in which a programming signal is generated by write driver circuitry (not shown) and applied across terminals of memory elements 102 and 112. For example, if memory elements 102 and 112 are implemented as CES elements, a set operation may be applied to memory element 102 and a reset operation may be applied to memory element 112 for bitcell circuit 110 to express or represent a first binary value, symbol, parameter or condition. Here, a first programming signal having a voltage $V_{set}$ and current $I_{set}$ may be applied across memory element 102 to place memory element 102 in a conductive or low impedance state while a second programming signal having a voltage $V_{reset}$ and current $I_{reset}$ may be applied across memory element 112 to place memory element 112 in an insulative or high impedance state. Likewise, a reset operation may be applied to memory element 102 and a set operation may be applied to memory element 112 for bitcell circuit 110 to express or represent a first binary value, symbol, parameter or condition. Here, a first programming signal having a voltage $V_{reset}$ and current $I_{reset}$ may be applied across memory element 102 to place memory element 102 in an insulative or high impedance state while a second programming signal having a voltage $V_{set}$ and current $I_{set}$ may be applied across memory element 112 to place memory element 112 in a conductive or low impedance state. It should be understood, however, that this is merely one example of how memory elements 102 and 112 may be placed in complementary impedance states to express or represent a single binary value, symbol, parameter or condition, and claimed subject matter is not limited in this respect.

According to an embodiment, a complementary impedance state of memory elements 102 and 112 may be detected in a "read operation" applied to memory elements 102 and 112. Such a read operation may determine for example, whether memory element 102 is in a conductive or low impedance state and memory element 112 is in an insulative or high impedance state (e.g., so that impedance states of memory elements 102 and 112 collectively represent or express a first binary symbol, value, parameter or condition), or whether memory element 102 is in an insulative or high impedance state and memory element 112 is in a conductive or low impedance state (e.g., so that impedance states of memory elements 102 and 112 collectively represent or express a second binary symbol, value, parameter or condition).

According to an embodiment, bitlines bl and nbl connected to memory elements 102 and 112, respectively, may each have a parasitic capacitance represented by capacitors 106 and 116. Accordingly, it should be understood that capacitors 106 and 116 as depicted in FIG. 1 do not necessarily refer to separately formed elements of a device, but may merely represent parasitic capacitances inherent to circuit 100. A read operation to detect complementary impedance states of memory elements 102 and 112 may be commenced by closing FETs N1 and N4 to connect bitlines bl and nbl to reference nodes 122 and 124 to fully discharge capacitors 106 and 116. Following discharge of capacitors 106 and 116, a voltage at WL applied to gates of FETs M1 and M2 may be increased to close FETs M1 and M2, connecting terminals of memory elements 102 and 112 to reference nodes 126 and 128, respectively. A voltage on read enable signal RE is raised such that voltages at gate terminals of PFETs P1 and P2 are lowered to connect bitlines bl and nbl to voltage source Vdd, and open NFET N11 to disconnect NFETs N3 and N15 from a reference node.

Following connection of connect bitlines bl and nbl to voltage source Vdd, capacitors 106 and 116 may begin to charge. Also, a first portion of current flowing from voltage source Vdd through PFET P1 may flow through in memory element 102 and a second portion of current flowing from voltage source Vdd through PFET P1 may charge capacitor 106. Similarly, a first portion of current flowing from voltage source Vdd through PFET P2 may flow through memory element 112 and a second portion of current flowing from voltage source Vdd through PFET P2 may charge capacitor 116. However, capacitors 106 and 116 may charge at different rates based on whether memory elements 102 and 112 are in a first complementary impedance state (e.g., to represent a first binary value, symbol, parameter or condition) or whether memory elements 102 and 112 are in a second complementary impedance state (e.g., to represent a second binary value, symbol, parameter or condition). For example, in a first complementary impedance state with memory element 102 in a conductive or low impedance state and memory element 112 in an insulative or high impedance state, current from voltage source Vdd may be higher in memory element 102 than in memory element 112 such that capacitor 116 will charge at a faster rate than capacitor 106. In a second complementary impedance state memory with element 102 in an insulative or high impedance state and memory element 112 in a conductive or low impedance state, current from voltage source Vdd may be higher in memory element 112 than in memory element 102 such that capacitor 106 will charge at a faster rate than capacitor 116.

According to an embodiment, a complementary impedance state of memory elements 102 and 112 may be detected based, at least in part, on a state of circuit 108 responsive to different rates of charging of capacitors 106 and 116 in a read operation. Bitline bl is connected to gate terminals of PFET P4 and NFET N3, and drain terminal of PFET P3 and NFET N15 while bitline nbl is connected to gate terminals of PFET P3 and NFET N15 and drain terminals of PFET P4 and NFET N3.

As may be observed, if capacitor 106 charges at a faster rate than capacitor 116 in a read operation (e.g., while memory element 102 is in an insulative or high impedance state and memory element 112 is in a conductive or low impedance state), PFET P4 will open to disconnect bitline nbl from voltage source Vdd and NFET N3 will close to connect bitline nbl to reference node 128. This may rapidly pull bitline nbl to a low voltage. Also, PFET P3 will close to connect bitline bl to voltage source Vdd and NFET N3 will open to disconnect bl from reference node 130, rapidly pulling bitline bl to a high voltage.

Similarly, if capacitor 116 charges at a faster rate than capacitor 106 in a read operation (e.g., while memory element 102 is in a conductive or low impedance state and memory element 112 is in an insulative or high impedance state), PFET P4 will close to connect bitline nbl to voltage source Vdd and NFET N3 will open to disconnect bitline nbl to reference node 128. This may rapidly pull bitline nbl to a high voltage Vdd. Also, PFET P3 will open to disconnect bitline bl from voltage source Vdd and NFET N3 will close to connect bl to reference node 130, rapidly pulling bitline bl to a low voltage at reference node 128. Accordingly, it may be observed that a complementary impedance state of memory elements 102 and 112 may be detected by sampling a voltage of either bitline bl or bitline nbl. In a specific implementation, bitlines bl and nbl may be provided to input terminals of a double-ended sense amplifier SA to provide an output signal having a value of "1" or "0" depending on the complementary impedance state of memory elements 102 and 112.

In a particular implementation, PFETs P1 and P2 of circuit 100 may be replaced with impedance elements IE1 and IE2 in circuit 150 as shown in FIG. 10. In one implementation, impedance elements IE1 and IE2 may be formed as resistor devices. In another particular embodiment in which memory elements 102 and 112 are implemented as correlated electron switch (CES) devices, impedance elements IE1 and IE2 may formed as CES devices having properties similar to memory elements 102 and 112. Here, impedance elements IE1 and IE2 formed as CES elements may be formed or placed in a low impedance or conductive state. According to an embodiment, impedance elements IE1 and IE2 may form a load may preventing an unintended reset of a selected non-volatile memory element in read operations.

Assuming, for example, that impedance elements IE1 and IE2, have the same resistance R of either memory element 102 or 112 while in a low impedance or conductive state, a voltage across terminals of the memory element 102 or 112 may be approximately $V_{dd}/3$ (which may be significantly lower than $V_{reset}$ to bring about an unintended reset operation in the memory element 102 or 112). This voltage may be lowered (e.g., to $V_{sense}/3$), for example, if a load from impedance element IE1 or IE2 is higher than R. It should be understood that in other implementations, a resistance of impedance element IE1 or IE2 may be greater than or less than twice the resistance of the memory element 102 or 112 while in a low impedance or conductive state. In one alternative implementation, the resistance of impedance element IE1 or IE2 may be about the same as the resistance of the memory element 102 or 112 while in a low impedance or conductive state. In another alternative implementation, the resistance of impedance element IE1 or IE2 may be about three times the resistance of the memory element 102 or 112 while in a low impedance or conductive state. It should be understood that these are merely examples of load that may be formed between a voltage source and a terminal of a selected non-volatile memory element, and claimed subject matter is not limited in this respect.

According to an embodiment, circuit 100 may be optionally configured to operate in a first mode in which a complementary impedance states of memory elements 102 and 112 may be mapped to a single value, condition or parameter out of two possible values, conditions or parameters (e.g., "0" or "1"), or a second mode in which impedance states of memory elements 102 and 112 may each independently map to a single value condition or parameter in a second mode. For example, while in the first mode, complementary impedance states of memory elements 102 and 112 may be mapped to a single bit value while in the second mode, impedance states of memory elements 102 and 112 may be mapped to two bits.

Figure 1C:
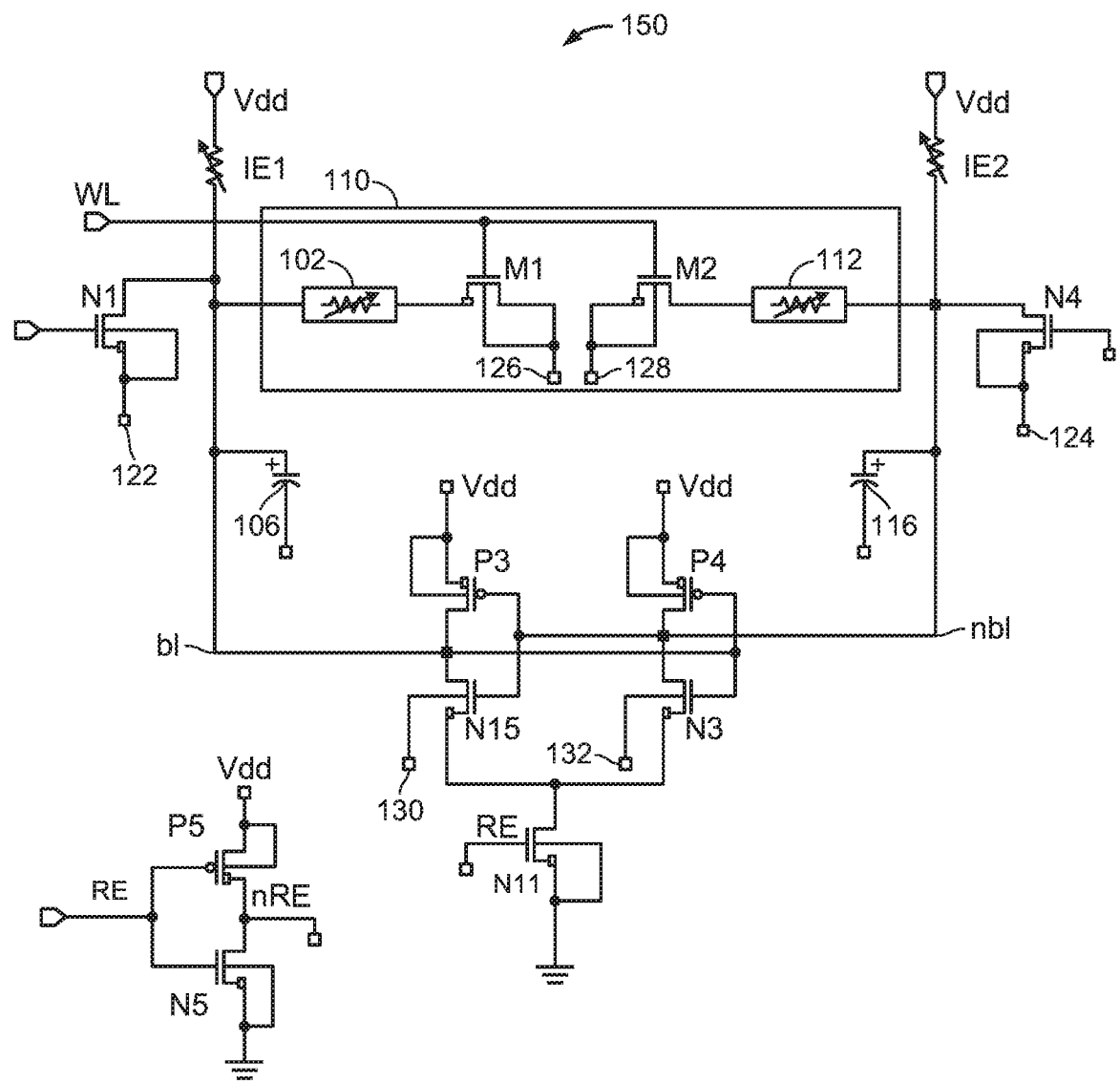
FIGS. 1C and 1D are schematic diagrams of alternative circuits for performing read operations in connection with a bitcell according to an alternative implementation.
Figure 1D:
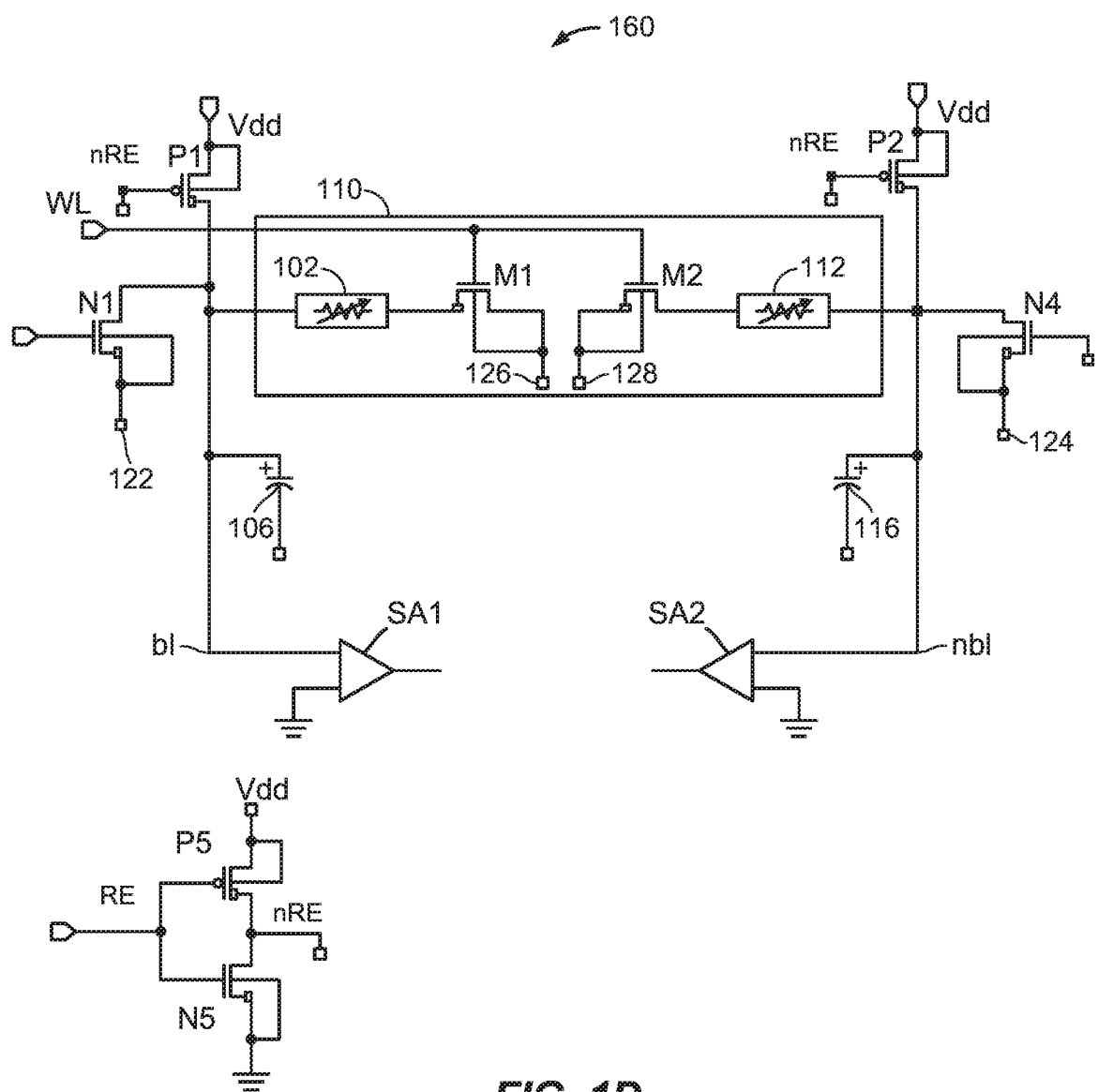

FIG. 1D shown an example, implementation of how memory elements 102 and 112 may be configured in a second mode in a circuit 160. Here, in a transition from a first mode of operation to the second mode of operation, bitlines bl and nbl may be disconnected from NFETs N3 and N15, and PFETs P3 and P4, and then connected to a terminal of a single-ended sense amplifier SA1 or SA2. While the first mode may enable a fast and reliable read operation (e.g., in conditions where a fast and reliable read operation may be desired), the second mode may enable a larger memory capacity (e.g., in conditions where a higher capacity memory may be desired).

Figure 2:
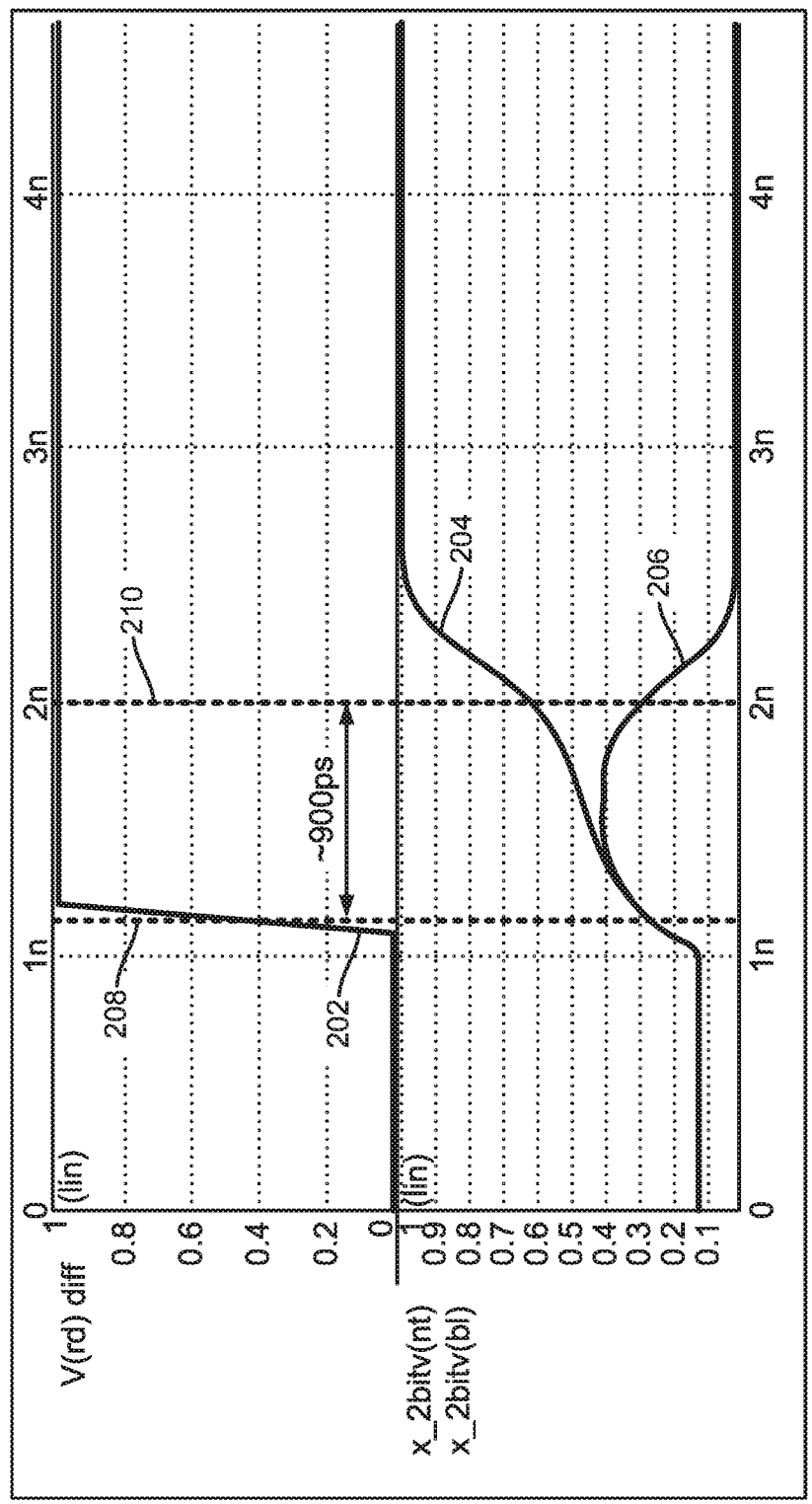
FIG. 2 is a plot illustrating aspects of behavior of a circuit according to an embodiment.

FIG. 2 is a plot illustrating aspects of behavior of a circuit during a read operation according to an embodiment circuit 100 discussed above (e.g., by closing NFETs N1 and N4). As discussed above, a read operation may commence by discharging bitlines connected to memory elements in complementary impedance states. Plot 204 indicates a subsequent change in magnitude of a voltage of a bitline (e.g., bitline bl) connected to a first memory element (e.g., memory element 102) in an insulative or high impedance state while plot 206 indicates a subsequent change in magnitude of a voltage of a bitline (e.g., bitline nbl) connected to a second memory element (e.g., memory element 112) in a conductive or low impedance state. As may be observed in the particular non-limiting example, magnitudes of voltages reflected in plots 204 and 206 increase at different rates with a voltage magnitude of plot 204 increasing faster than a voltage magnitude of plot 206. Additionally, magnitudes of voltages reflected in plots 204 and 206 deviate sufficiently at ~900 ps following commencement of a read operation to detect complementary impedance states of the first and second memory elements. Plot 202 shows a voltage of read enable signal RE shown in FIGS. 1A, 1C and 1D. Time 208 is an instance in a read operation in which PFETs P3 and P4 open or close to rapidly pull either bl or nbl to voltage Vdd.

Figure 3:
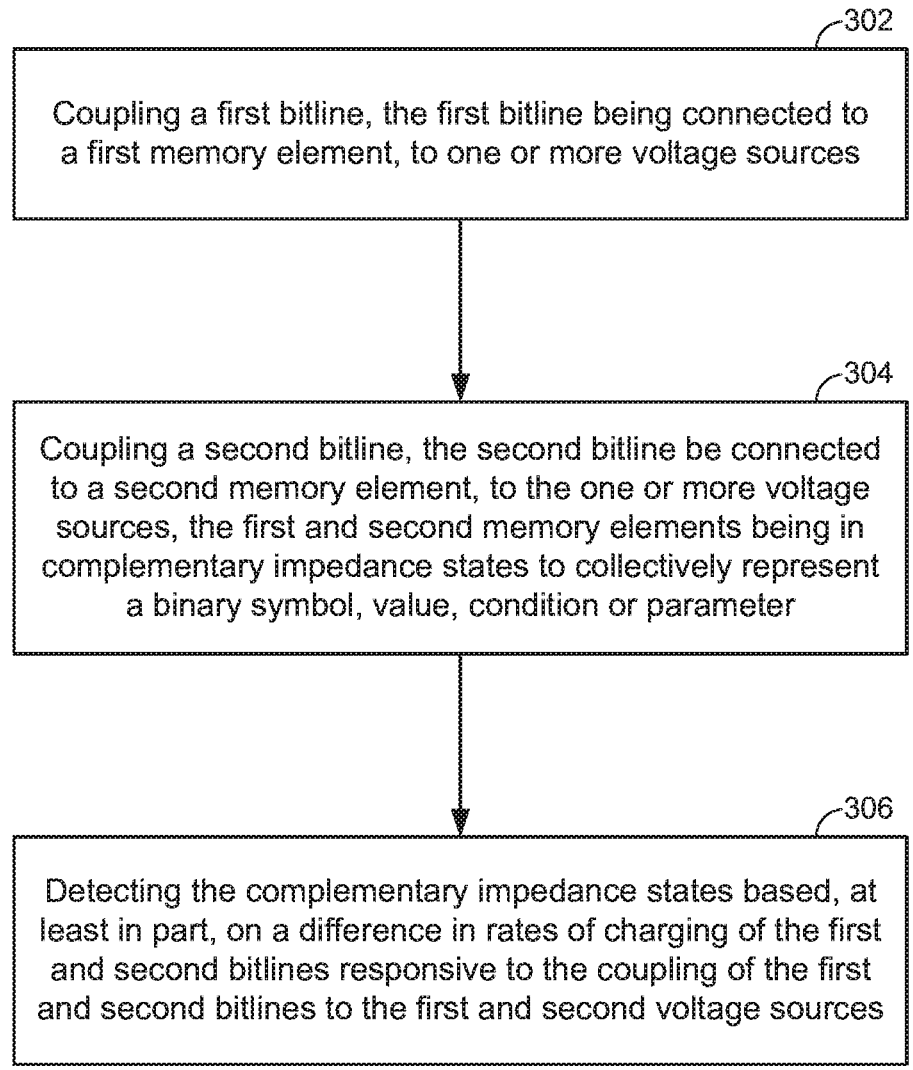
FIG. 3 is a flow diagram of a process according to an embodiment.

FIG. 3 is a flow diagram of a process according to an embodiment of circuit 100 in FIG. 2. Actions at blocks 302, 304 and 306 may be performed in connection with a read operation to detect complementary impedance states of two memory elements expressing or representing a binary value, symbol, parameter or condition as discussed above. In an embodiment, the two memory elements may be placed in the complementary impedance states in the course of one or more preceding write operations. Blocks 302 and 304 may comprise coupling first and second bitlines to one or more voltage sources. For example, PFETs P1 and P2 may close to couple bitlines bl and nbl to voltage sources. Action at blocks 302 and 304 may be preceded by action to discharge capacitances of the first and second bitlines. For example, capacitors 106 and 116 may be discharged by closing NFETs N1 and N14 to connect bitline bl to reference node 122 and connect reference node 124.

Block 306 may comprise detecting complementary impedance states of the first and second memory elements based, at least in part, on different rates at which first and second bitlines are charged following coupling the first and second bitlines to voltage sources at blocks 302 and 304. For example, as discussed above, PFET P4 may couple bitline nbl to a voltage source and NFET N15 may couple bitline bl to reference node 128 if memory 102 is in a conductive or low impedance state and memory element 112 is in an insulative or high impedance state. Likewise, PFET P3 may couple bitline bl to a voltage source and NFET N15 may couple bitline nbl to reference node 130 if memory 102 is in a conductive or low impedance state and memory element 112 is in an insulative or high impedance state. Complementary impedance states of memory devices 102 and 112 may then be determined by sampling either bitline bl or nbl.

Figure 4:
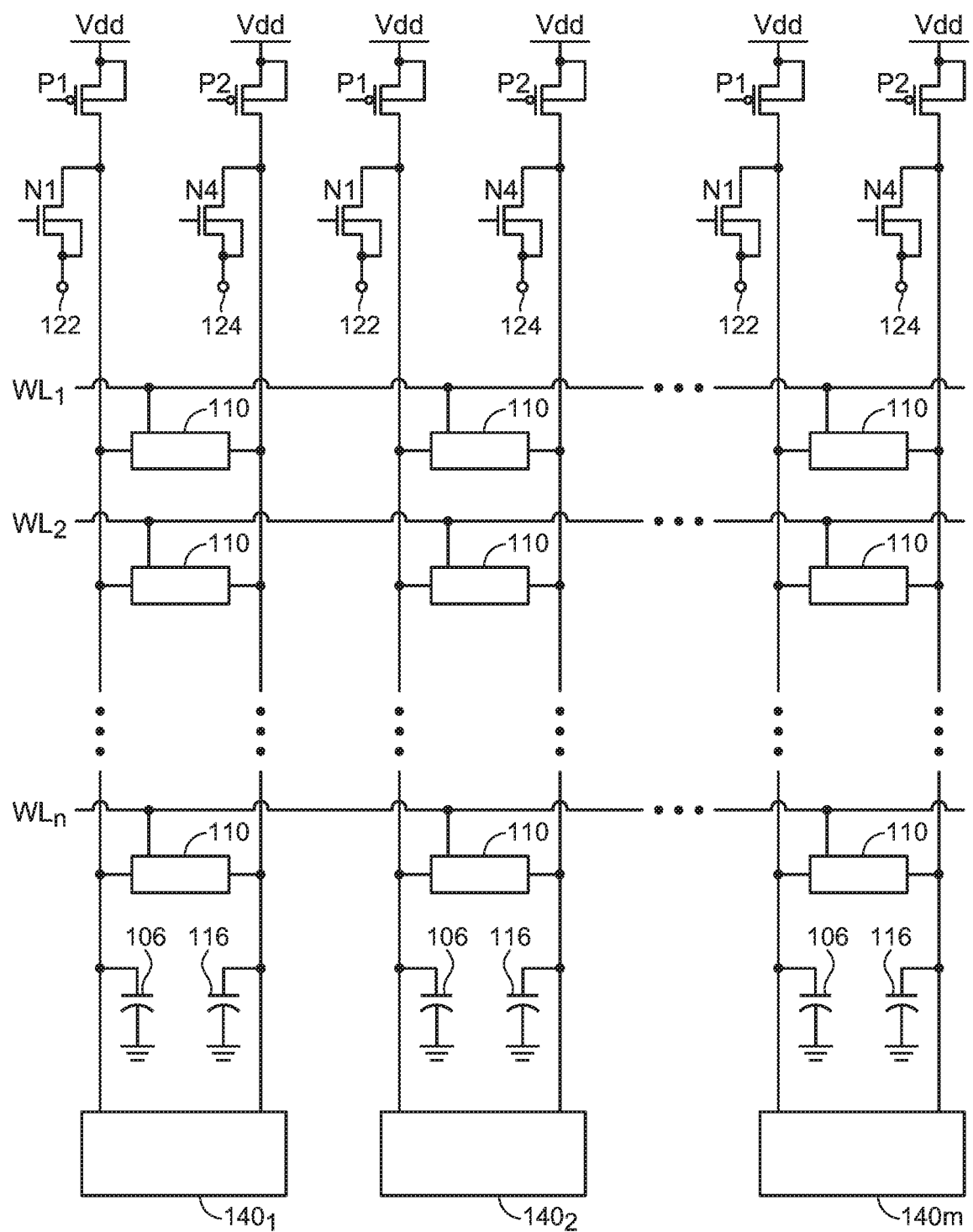
FIG. 4 is a schematic diagram of a multi-bitcell memory array according to an embodiment.

According to an embodiment, multiple bitcells such as a bitcell formed according to bitcell circuit 110 may be configured in an array of bitcells as shown in FIG. 4. Here, a row of bitcell circuits may be accessible in a read operation responsive to a voltage signal on a corresponding wordline WL (e.g., closing corresponding NFETs M1 and M2 shown in FIGS. 1A, 1C and 1D). Input/output (I/O) circuits 140 connected to corresponding bitlines bl and nbl may facilitate read or write operations applied to the row of accessed bitcells. The particular implementation of FIG. 4 shows PFETs P1 coupled between a voltage source Vdd and corresponding bitlines bl and PFETs P2 coupled between voltage source Vdd and corresponding bitlines nbl. In an alternative implementation, PFETs P1 and P2 may be replaced by corresponding impedance elements IE1 and IE2 as illustrated in FIG. 1C.

I/O circuits 140 may be configured differently depending on a particular mode of operation as discussed above. For example, if bitcell circuits 110 are to operate in a first mode where complementary impedance states of associated memory elements 102 and 112 map to a single value, condition or parameter, associated I/O circuits 140 may couple NFETs N3 and N15, and PFETs P3 and P4 to associated bitlines bl and nbl as shown in the configurations of FIGS. 1A and 1C. If bitcell circuits 110 are to operate in a second mode where associated memory elements 102 and 112 are to represent two independent values, conditions or parameters, associated I/O circuits 140 may couple associated bitlines bl to associated sense amplifiers SA1 and couple associated bitlines nbl to associated sense amplifiers SA2.

As pointed out above, memory elements described above (e.g., memory elements 102 and 112) may comprise memory elements including correlated electron switch (CES) elements incorporating a Correlated Electron Material (CEM). In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In a particular implementation, a CES element may switch resistive states responsive to a Mott-transition in the majority of the volume of the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES element may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a write operation.

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 5A:
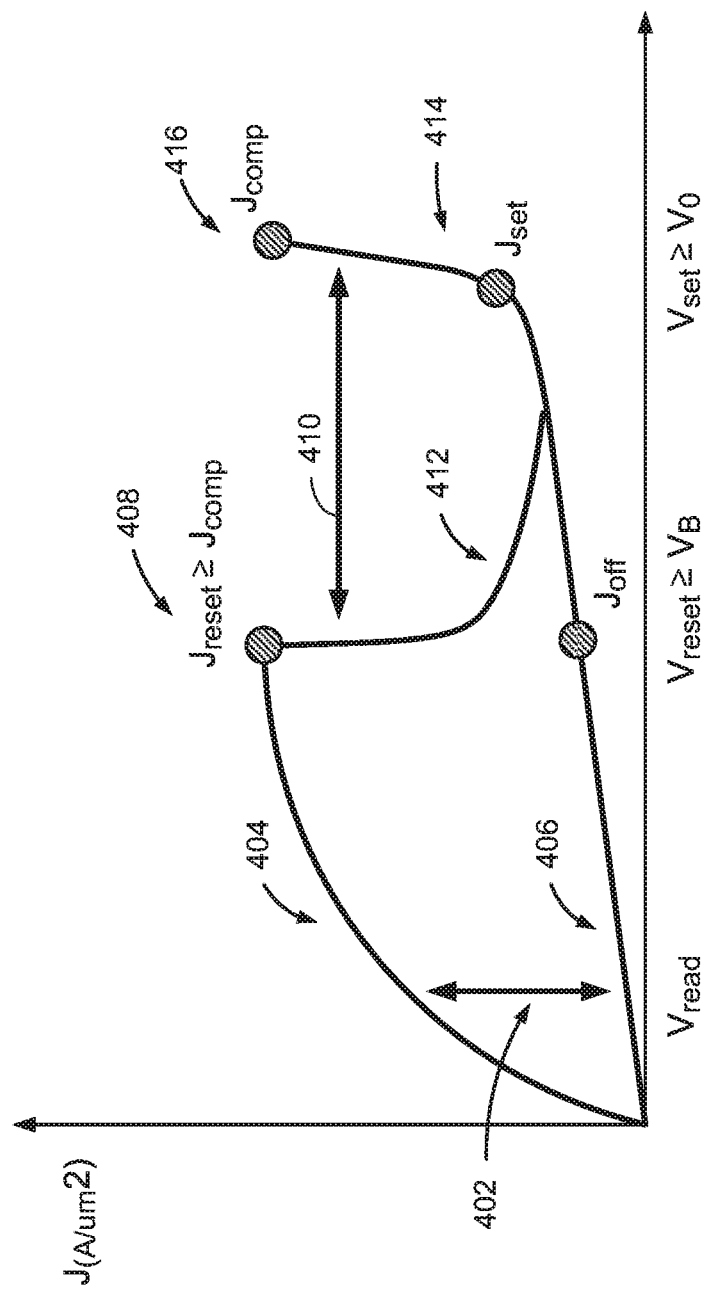
FIG. 5A shows a plot of current density versus voltage for a CES device according to an embodiment.

FIG. 5A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES device of FIG. 5A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 5A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO($C_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch from a conductive state to an insulator state via the Mott transition. This may occur at point 408 of the plot in FIG. 4A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 5A, a current density $J_{comp}$ applied during a write operation at point 416 to place the CES element in a conductive or low impedance state may determine a compliance condition for placing the CES device in a high impedance or insulative state in a subsequent write operation. As shown, the CES device may be subsequently placed in an insulative or high impedance state by application of a current density $J_{reset} \geq J_{comp}$ at a voltage $V_{reset}$ at point 408, where $J_{comp}$ is externally applied.

The compliance therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 408. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \quad (1)$$
$$n = \left(\frac{C}{\lambda_{TF}}\right)^3$$

where:
$\lambda_{TF}$ is a Thomas Fermi screening length; and
C is a constant.

According to an embodiment, a current or current density in a region 404 of the plot shown in FIG. 5A may exist in response to injection of holes from a voltage signal applied across terminals of CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$
$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and close the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \quad (4)$$
$$Q(V_{MI}) = qn(V_{MI})$$
$$I_{MI}(V_{MI}) = \frac{Q(V_{MI})}{t} = \frac{qn(V_{MI})}{t} = \frac{q}{t}\left(\frac{C}{a_B}\right)^3$$
$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
$a_B$ is a Bohr radius.

According to an embodiment, a "read window" 402 for detecting an impedance state of a CES element in a read operation may be set out as a difference between a portion 406 the plot of FIG. 5A while the CES element is in an insulative state and a portion 404 of the plot FIG. 5A while the CES element is in a conductive state at a read voltage $V_{read}$. In a particular implementation, read window 402 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 410 for placing a CES element in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 410 may be determined based, at least in part, by materials and doping of the CES element.

Figure 5B:
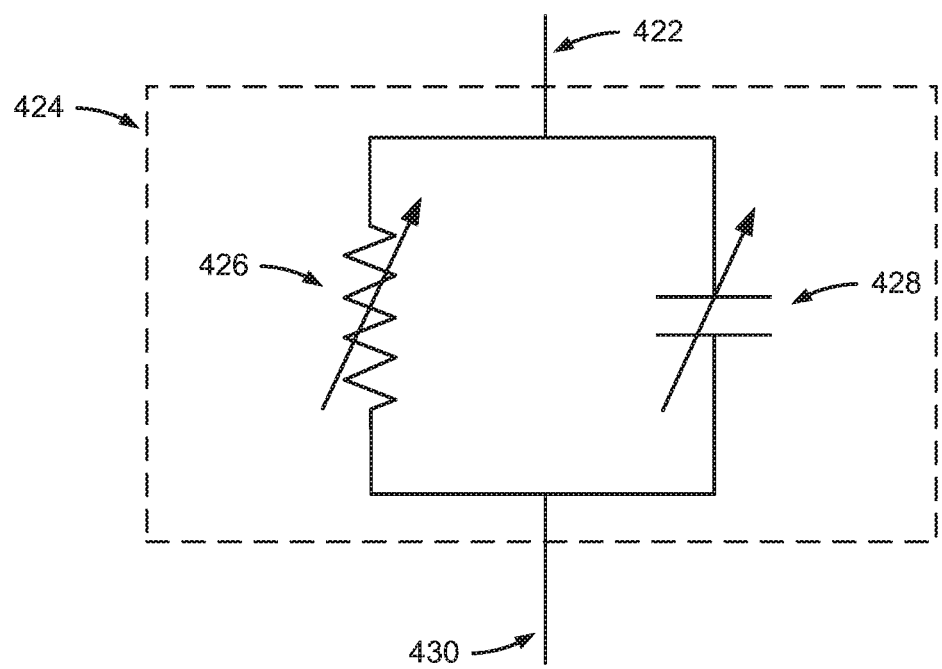
FIG. 5B is a schematic diagram of an equivalent circuit to a CES device according to an embodiment.

The transition from high resistance/capacitance to low resistance/capacitance in a CES element may be represented by a singular impedance of the CES element. FIG. 5B depicts a schematic diagram of an equivalent circuit of an example variable impeder device (such as a CES element), such as variable impeder device 424. As mentioned, variable impeder device 424 may comprise characteristics of both variable resistance and variable capacitance. For example, an equivalent circuit for a variable impeder device may, in an embodiment, comprise a variable resistor, such as variable resistor 426 in parallel with a variable capacitor, such as variable capacitor 428. Of course, although a variable resistor 426 and variable capacitor 428 are depicted in FIG.

5B as comprising discrete components, a variable impeder device, such as variable impeder device 424, may comprise a substantially homogenous CEM element, wherein the CEM element comprises characteristics of variable capacitance and variable resistance. Table 1 below depicts an example truth table for an example variable impeder device, such as variable impeder device 400.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In the particular implementation of a CES element of FIG. 5A, the CES element may be placed in either of two different impedance states: a low impedance or conductive state responsive to a set operation and a high impedance or insulative state responsive to a reset operation.

A write operation to place a CES element in a particular memory state of a plurality of predetermined memory states may comprise application of a "programming signal" to terminals of the CES element. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a CES element in a particular memory state in a write operation may be controlled to have a particular voltage level and current level corresponding to the particular memory state.

As described in a particular implementation below, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In a further embodiment, one or more of a plurality of memory elements (e.g., CES elements) may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective memory devices, in an embodiment. In a further embodiment, memory devices may be formed in devices in combination with conducting elements as described herein formed by the same or different processes. In an example implementation, memory devices may be formed in combination with conducting elements using a different and/or complementary process technologies such as complementary metal oxide semiconductor (CMOS) technologies. For example, conducting elements such as NFET and PFET devices may be formed using well known processes and techniques.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
   a first memory element and a second memory element to have complementary impedance states, the complementary impedance states to collectively represent a binary symbol, value, condition and/or parameter, a first terminal of the first memory element and a first terminal of the second memory element to be coupled to one or more reference nodes;
   a first bitline coupled to a second terminal of the first memory element;
   a second bitline coupled to a second terminal of the second memory element; and
   a circuit to detect the complementary impedance states responsive to a difference in rates of charging of the first and second bitlines.

2. The device of claim 1, and further comprising a circuit to map the detected complementary impedance states to the single binary symbol, value, condition and/or parameter.

3. The device of claim 1, wherein the first and second memory elements are configurable to have two independent impedance states to represent two independent binary symbols, values, conditions and/or parameters.

4. The device of claim 3, and further comprising a first sense amplifier to detect an impedance state of the first memory element and a second sense amplifier to detect an impedance state of the second memory element.

5. The device of claim 1, and further comprising one or more voltage source circuits to be coupled to the first and second bitlines in a read operation.

6. The device of claim 2, wherein a magnitude of voltage on the first bitline to increase at a rate higher than a magnitude of a voltage on the second bitline responsive at least in part to the first memory element being in an insulative and/or high impedance state and the second memory element being in a conductive and/or low impedance state.

7. The device of claim 1, wherein the circuit to detect the complementary impedance states responsive to the difference in the rates of charging of the first and second bitlines to comprise a first inverter circuit coupled to the first bitline and a second inverter circuit coupled to the second bitline.

8. The device of claim 1, wherein the first terminals of the first and second memory elements to be coupled to the one or more reference nodes responsive to a wordline voltage.

9. The device of claim 1, wherein the circuit to detect the complementary impedance states further to comprise:
   a first conducting element to couple the first bitline to a first voltage source circuit responsive to the first memory element being in an insulative and/or high impedance state and the second memory element being in a conductive and/or low impedance state; and
   a second conducting element to couple the second bitline to a first reference node responsive to the first memory element being in the insulative and/or high impedance state and the second memory element being in the conductive and/or low impedance state.

10. The device of claim 9, wherein the circuit to detect the complementary impedance states further to comprise:
   a third conducting element to decouple the first bitline from a second reference node responsive to the first memory element being in the insulative and/or high impedance state and the second memory element being in the conductive and/or low impedance state; and a fourth conducting element to decouple the second bitline from a second voltage source circuit responsive to the first memory element being in the insulative and/or high impedance state and the second memory element being in the conductive and/or low impedance state.

11. The device of claim 9, wherein the circuit to detect the complementary impedance states further to detect the complementary impedance states based, at least in part, on a voltage of the first bitline or a voltage on the second bitline.

12. The device of claim 1, wherein the first bitline to be coupled to a voltage source circuit through a first impedance element and the second bitline to be coupled to the voltage source circuit through a second impedance element, and wherein respective impedances of the first and second impedance elements to match respective impedances of the first and second memory elements while in a low impedance and/or conductive impedance state.

13. The device of claim 1, wherein the first and second memory elements to comprise first and second correlated electron switch (CES) elements.

14. A method comprising:
coupling a first bitline, the first bitline being connected to a first memory element, to one or more voltage source circuits;
coupling a second bitline, the second bitline being connected to a second memory element, to the one or more voltage source circuits, the first and second memory elements being in complementary impedance states to collectively represent a binary symbol, value, condition and/or parameter; and
detecting the complementary impedance states based, at least in part, on a difference in rates of charging of the first and second bitlines responsive to the coupling of the first and second bitlines to the one or more voltage source circuits.

15. The method of claim 14, and further comprising mapping the detected complementary impedance states to the binary symbol, value, condition and/or parameter.

16. The method of claim 14, and further comprising discharging the first and second bitlines prior to coupling the first bitline and the second bitline to the one or more voltage source circuits.

17. The method of claim 14, wherein detecting the complementary impedance states further comprises:
coupling the first bitline to a first voltage source circuit responsive to the first memory element being in an insulative and/or high impedance state and the second memory element being in a conductive and/or low impedance state; and
coupling the second bitline to a first reference node responsive to the first memory element being in the insulative and/or high impedance state and the second memory element being in the conductive and/or low impedance state.

18. An apparatus comprising:
a plurality of bitcells formed as an array bitcells, wherein respective bitcells to comprise first and second memory elements, respective bitcells to be coupled to at least one other bitcell of the plurality of bitcells by a first bitline and a second bitline, wherein the first memory element and the second memory element to have complementary impedance states, the complementary impedance states to collectively represent a binary symbol, value, condition and/or parameter; and
at least one circuit to detect the complementary impedance states of first and second memory elements of a selected at least one of the plurality of bitcells responsive to a difference in rates of charging of the first and second bitlines.

* * * * *